United States Patent
Liu et al.

(10) Patent No.: US 10,331,044 B2
(45) Date of Patent: Jun. 25, 2019

(54) DYNAMIC-MAGNETIC STEEL MAGNET LEVITATION DOUBLE-WORKPIECE-STAGE VECTOR ARC SWITCHING METHOD AND APPARATUS BASED ON WIRELESS ENERGY TRANSMISSION

(71) Applicant: HARBIN INSTITUTE OF TECHNOLOGY, Harbin (CN)

(72) Inventors: Yongmeng Liu, Harbin (CN); Jianwei Wu, Harbin (CN); Jiubin Tan, Harbin (CN)

(73) Assignee: HARBIN INSTITUTE OF TECHNOLOGY, Harbin (CN)

(*) Notice: Subject to any disclaimer, the term of this patent is extended or adjusted under 35 U.S.C. 154(b) by 0 days.

(21) Appl. No.: 16/069,198

(22) PCT Filed: Aug. 31, 2016

(86) PCT No.: PCT/CN2016/097501
§ 371 (c)(1),
(2) Date: Jul. 11, 2018

(87) PCT Pub. No.: WO2017/121126
PCT Pub. Date: Jul. 20, 2017

(65) Prior Publication Data
US 2019/0033731 A1 Jan. 31, 2019

(30) Foreign Application Priority Data
Jan. 14, 2016 (CN) .......................... 2016 1 0023022

(51) Int. Cl.
*G03F 7/20* (2006.01)
*H01L 21/02* (2006.01)

(52) U.S. Cl.
CPC ............ *G03F 7/70725* (2013.01); *G03F 7/20* (2013.01); *G03F 7/70733* (2013.01); *H01L 21/02* (2013.01)

(58) Field of Classification Search
CPC .. G03F 7/707; G03F 7/70691; G03F 7/70725; G03F 7/70733; G03F 7/70775; G03F 7/70758; G03F 7/70766
See application file for complete search history.

(56) References Cited

U.S. PATENT DOCUMENTS

| | | | |
|---|---|---|---|
| 6,417,914 B1* | 7/2002 | Li | ........................ G03B 27/58 310/12.06 |
| 2003/0076482 A1* | 4/2003 | Inoue | ..................... G03B 27/42 355/53 |
| 2007/0273860 A1* | 11/2007 | Tanaka | ................ G03F 7/70716 355/72 |

\* cited by examiner

*Primary Examiner* — Steven Whitesell Gordon
(74) *Attorney, Agent, or Firm* — Na Xu; IPro, PLLC

(57) ABSTRACT

A dynamic-magnetic steel magnetic levitation double-workpiece-stage vector arc switching method and apparatus based on wireless energy transmission, falling within the semiconductor manufacturing equipment technology. The apparatus comprises a support frame (1), a balance mass block (2), magnetic levitation workpiece stages (4a, 4b), a workpiece stage measurement apparatus, wireless energy transmission apparatuses (5a, 5b) and a wireless energy receiving apparatus (406), wherein the two workpiece stages work between a measurement site (11) and an exposure site (12); a laser interferometer (6) is used to measure the positions of the workpiece stages; the wireless energy transmission apparatuses (5a, 5b) are used to provide energy for a sensor (407) in a micro-drive stage; the workpiece stages are driven using a magnetic levitation planar electrical motor; and during a double-workpiece-stage switching process, the planar electrical motor is used to drive the two workpiece stages so as to achieve single-beat arc quick (Continued)

switching. By using the method and apparatus, the problem that an existing stage switching scheme has many beats, a long track, many start-stop links and a long time for stabilization is solved, thereby reducing the stage switching links, shortening the stage switching time, and improving the productivity of a lithography machine.

1 Claim, 4 Drawing Sheets

DYNAMIC-MAGNETIC STEEL MAGNET LEVITATION DOUBLE-WORKPIECE-STAGE VECTOR ARC SWITCHING METHOD AND APPARATUS BASED ON WIRELESS ENERGY TRANSMISSION

FIELD OF THE INVENTION

The presented invention relates to semiconductor manufacturing equipment, and mainly relates to a vector arc revolve switching method for dynamic-magnetic steel magnet levitation double-workpiece-stage system based on wireless energy transmission and apparatus thereof.

BACKGROUND OF THE INVENTION

A lithography machine is one of the most important ultra-precision equipment in nanometer scale integrated circuit manufacturing. A double-workpiece-stage is one of the key subsystems of the lithography machine and greatly determines the resolution, precision and productivity of the lithography machines.

Productivity is a main goal that pursued in the development of lithography machines. When the resolution, accuracy and efficiency requirements are fulfilled, productivity of the lithography machine is a development direction of the wafer stage technology. The most straightforward way to improve operating efficiency is to improve the acceleration and the velocity of the wafer stage, however, unlimited increase of the acceleration and the velocity will reduce the original precision. The wafer stage was initially designed with only one silicon wafer fixing device, the lithography machine can only manufacture one silicon wafer in a serial process which results in a low productivity. A double-workpiece-stage system is then proposed, which is so far the prevailing technical means to improve productivity of lithography machine. The double-workpiece-stage system is equipped with one exposure station, one measurement station and two wafer stages. Exposure and measurement adjustments can be processed in parallel, which can greatly reduce time and improve production efficiency. A representative product is a double-workpiece-stage lithography machines based on Twinscan technology provided by ASML Company in the Netherlands.

Currently, improving the operating efficiency of a double-workpiece-stage system is one of the technical development goals for lithography machines. Double-workpiece-stage technology involves the transposition of two wafers between the two stations. The transposition efficiency directly affects the operating efficiency of the system and consequently the lithography productivity. How to reduce transposition time of a double-workpiece-stage system and minimize the interference on other subsystems has always been a focus of study. In conventional double-workpiece-stage transposition processes, the double-workpiece-stages are driven linearly in both the exposure and measurement processes. In US2001/0004105A1 and WO98/40791, which are double-workpiece-stage system related patents, each wafer stage has two exchangeable units to achieve the double-workpiece-stage transposition process. This arrangement can improve productivity of the machine without increasing the operating speed of the double-workpiece-stage. However due to the coupling connection between the work station and the rail, the double-workpiece-stage will temporarily separate from the driving unit in the process of transposition, which will have considerable influence on the positioning accuracy of the double-workpiece-stage. At the same time, as the movement unit and the guide rail longer and the mass of the moving parts are greater, it may adversely affect the enhancement of movement speed and acceleration. Chinese Patent No. CN101609265 proposes a double-workpiece-stage switching system based on planar motor driven, in which a stator of the planar motor is arranged on the top of a base stage and a mover is arranged at the bottom of the double-workpiece-stage. The double-workpiece-stage and the driving unit are never separated from the linear motor drive. In Chinese Patent No. CN101694560, a double-workpiece-stage transposition system driven by airfoil support permanent magnet planar motor is proposed, in which the wafer stage is driven by a planar motor and supported by airfoil to avoid the problem that the driving units and the double-workpiece-stage may separate during the transposition process. Meanwhile, the running resistance of the double-workpiece-stage and the drive current and the heat of the planar motor are reduced.

Compared with the linear transposition strategy of double-workpiece-stage mentioned in the above patents, revolving transposition strategy of wafer stages has a unique advantage, and dual-stage with the revolving transposition technology emerged. Chinese Patent No. CN101071275 adopts the method of revolving the whole pedestal to realize the transposition of the two wafer stages. This arrangement can simplify the structure of the system, and the movement of the two wafer stages is not overlapping with each other, thereby potential danger such as collision can be avoided. However, when the whole pedestal is revolved to achieve the wafer stage transposition, problems such as large revolve inertia, imprecise position of the high-power revolve motor, and the system temperature rising due to greater heat generation may arise. Meanwhile, the larger radius of revolve increases the dimension of the main structure of the lithography machine. Chinese Patent No. CN102495528, the invention adopts a revolve transposition table in the center of the base station to complete the transposition process of the two wafer stages, which is divided into three steps, but the revolve position accuracy is low.

There are many sensors in the double-workpiece-stage. Traditional double-workpiece-stage uses cable transmission energy model or battery to supply energy model for the sensors. For the use of cable transmission energy model, the dragging effect of the cable affects the positioning and reduces the accuracy of the micro-movement-stage. For the use of battery power supply mode, the weight of the battery affects the resolution, accuracy and efficiency of photolithography, so it is not a good choice.

SUMMARY OF THE INVENTION

To solve the shortcomings of the existing technology, the invention provides a vector arc revolve switching method for a dynamic-magnetic-steel magnet-levitation double-workpiece-stage system based on wireless energy transmission and apparatus thereof. The method and apparatus can realize a single-step and fast vector arc revolve switching of double-workpiece-stage system, to reduce wafer switching time, and increase productivity of the lithography machine.

One objective of the invention is achieved by providing a vector arc revolve switching method for a moving-magnet-steel magnet-levitation double-workpiece-stage system based on wireless energy transmission, the method comprises: in an initial working state, providing a first wafer stage in a pre-alignment state in a measurement position, providing a second wafer stage in an exposure state in an exposure position; in a first step, completing a pre-alignment process of the first wafer stage in the measurement position, driving the first wafer stage by a moving magnet to a preset pre-transposition position A of the measurement position, the first wafer stage is then charged by wireless energy transmission and waits; completing an exposure process of the second wafer stage in the exposure position, driving the second wafer stage by the moving magnet to a preset position C of the exposure position. In a second step, moving the first wafer stage and the second wafer stage counter-clockwise along a vector circular arc path through a vector control of a planar motor, during the movement, maintaining the phases of the first and second wafer stages unchanged and measuring the movement positions of the first and the second wafer stages by laser interferometers; completing the switching process of the first and the second wafer stages by moving the first wafer stage to the preset position C in the exposure position and moving the second wafer stage to a preset position D in the measurement position; then a silicon wafer in the first wafer stage is lithographed and exposed in the exposure position and once the exposure is finished, the finished one is replaced by a new silicon wafer and the new silicon wafer is pre-aligned on the second wafer stage in the measurement position; in a third step, completing a pre-alignment process in the measurement position, driving the second wafer stage to the preset position A of the measurement position, then the second wafer stage is then charged by wireless energy transmission and waits; completing an exposure process in the exposure position, driving the first wafer stage to the preset position C of the exposure position; in a fourth step, moving the second wafer stage and the first wafer stage clockwise along the circular arc path through another vector control of the planar motor; when the second wafer stage is moved to the preset position C in the exposure position and the first wafer stage is moved to the preset position D in the measurement position, the transposition process of wafer stages is completed, the silicon wafer in the second wafer stage is lithographed and exposed in the exposure position and the finished wafer is replaced by another new silicon wafer; the new silicon wafer is pre-aligned on the first wafer stage in the measurement position; at this time, the system returns to the initial working state, an operating cycle of transposition operation of the two wafer stages is completed, and the measurement, exposure, and transposition processes of the charge and communication of two wafer stages are all completed via wireless energy transmission.

The proposed apparatus is a vector arc revolve switching apparatus for a moving-magnet-steel magnetic-levitation double-workpiece-stage system based on wireless energy transmission. The apparatus comprises a support frame, a balance mass block, a first wafer stage, a second wafer stage; the balance mass block is positioned above the support frame, a stator of macro movement planar motor is mounted on an upper surface of the balance mass block; the first wafer stage and the second wafer stage are arranged above the stator of macro movement planar motor; the first wafer stage and the second wafer stage are operatable between a measurement position and an exposure position, a metrology frame is supported on the support frame by airbearing and six laser interferometers are installed on the metrology frame, the first wireless energy transmitter apparatus and the second wireless energy transmitter apparatus are installed above the first wafer stage and the second wafer stage respectively; the first wafer stage and the second wafer stage are both six-DOF (degree of freedom) magnetic levitation micro movement stage, which is comprised of a chuck, a sucker, a micro movement planar motor, an anti-collision frame, a mover of the macro movement planar motor, wireless energy receivers apparatus and a leveling focusing sensor; the micro movement planar motor is comprised of a mover of micro movement planar motor and a mover of gravity compensator; the sucker is mounted on the chuck, and four corners of the chuck are provided with four wireless energy receiver apparatus and four leveling focusing sensors; the chuck is fixed to the micro movement planar motor, and the anti-collision frame is mounted around the micro movement planar motor; the mover of macro movement planar motor is arranged below the anti-collision frame; the mover of macro movement planar motor is formed by staggered arrangement of magnetic steel arrays and the stator of macro movement planar motor is arranged in herringbone arrangement of the coil arrays.

The invention has following innovative points and outstanding advantages:

1) a vector arc revolve switching method for double-workpiece-stage is proposed to reduce the switching time and improve the switching efficiency. The invention adopts vector arc revolve switching strategy for to optimize the existing multi-step linear transposition of the double-workpiece-stage as a single-step quick switching with less starting and stopping times and less stabilizing links. Meanwhile, the vector arc revolve switching trajectory planning is adopted to shorten the trajectory of the stage transposition, the impact of the revolve transposition force is small and the setting time is short. This is the first innovation and outstanding advantage of the invention.

2) Propose a dynamic-magnetic-steel driving magnetically-levitated micro planar motor. The composited current driving ways have the advantages of high power vector control, long moving range, large pull-force density, good dynamic performance, high winding utilization rate, uniform temperature distribution, small thermal deformation, high position accuracy etc. This is the second innovation and outstanding advantage of the invention.

3) Propose a wireless energy transmission charging and signal communication method for wafer stage. The method can effectively avoid the drag and drop force of the cable to the wafer stage and the total synchronous motion of the cable table and the wafer stage in the traditional switching scheme, and then improve the positioning accuracy of the wafer stage. At the same time, by using the wireless energy transmission charging and communication, the weight of the wafer stage can be reduced, the structure is simple, and the balance quality is reduced. This is the third innovation and outstanding advantage of the invention

Figure 1:
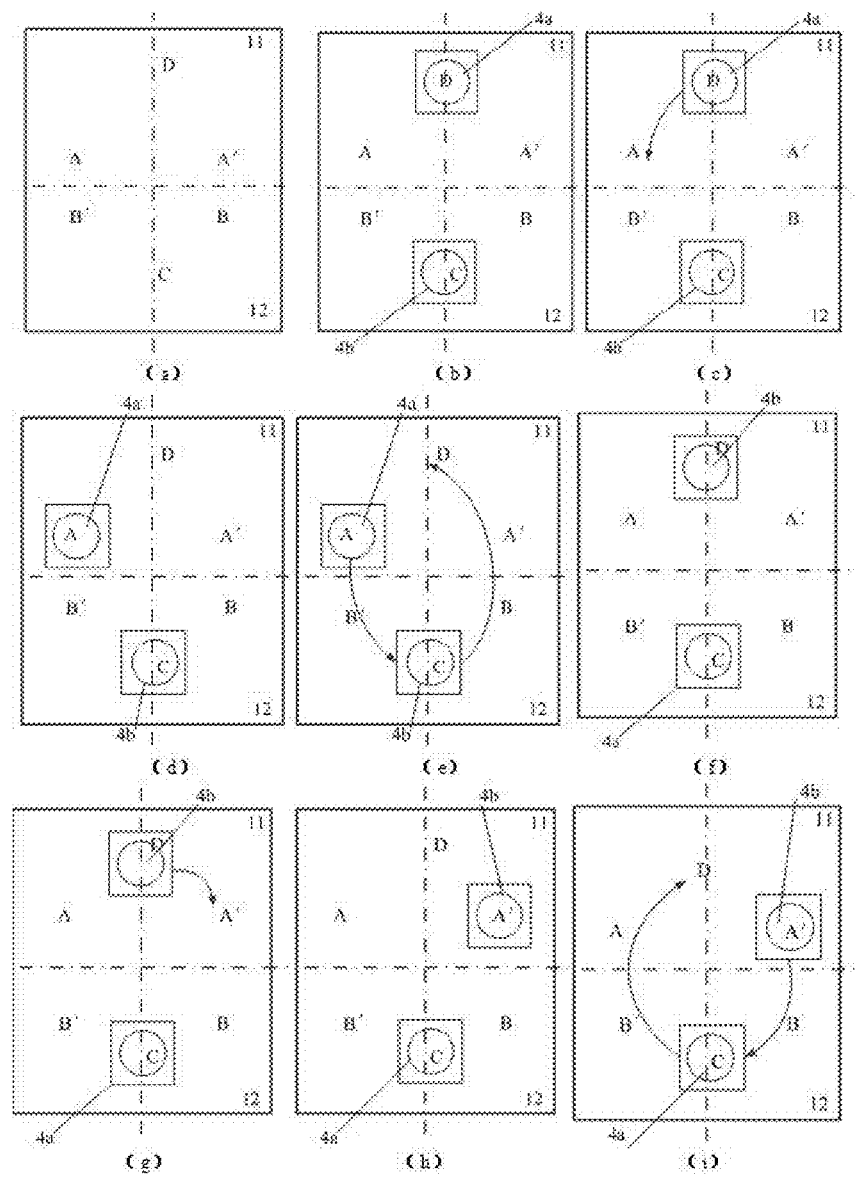
FIG. 1 is a schematic diagram of vector arc quick revolve switching method based on wireless energy transmission with one step optimization for the moving magnet levitated double-workpiece-stage system.
Figure 2:
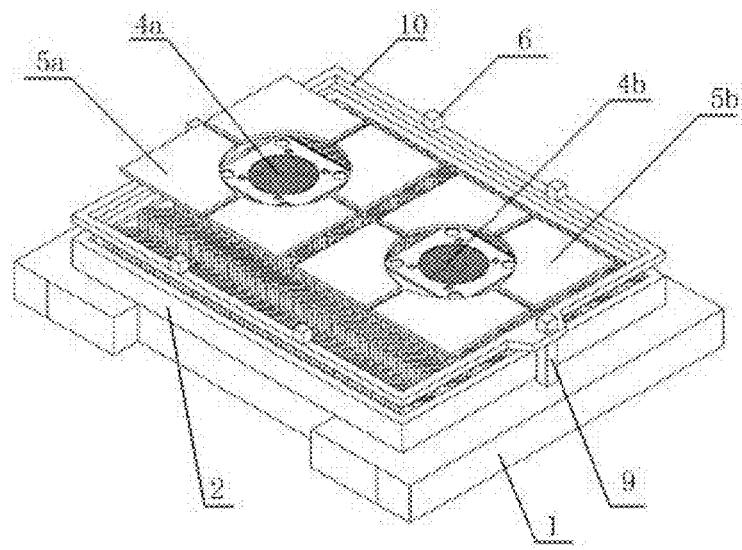
FIG. 2 is a schematic diagram of the overall structure of the vector arc revolve switching apparatus based on wireless energy transmission for the moving magnet levitated double-workpiece-stage system.
Figure 3:
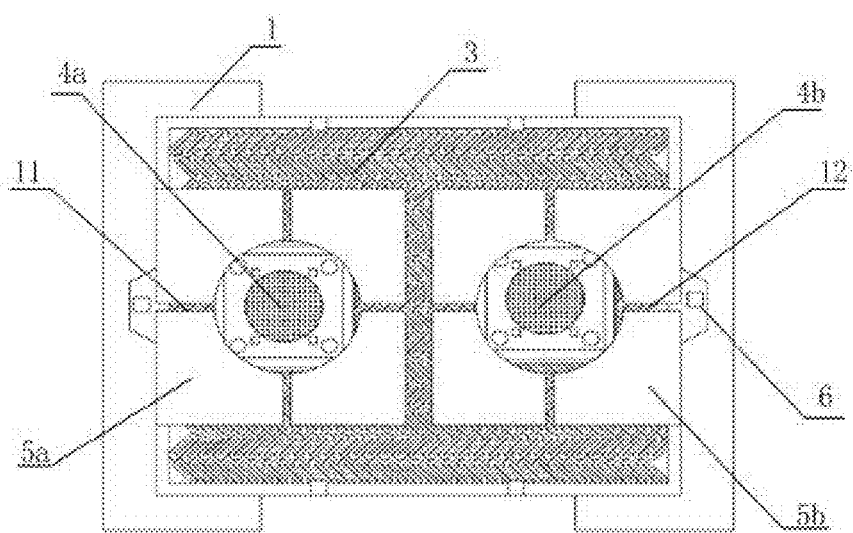
FIG. 3 is a sectional view of a double-workpiece-stage system.
Figure 4:
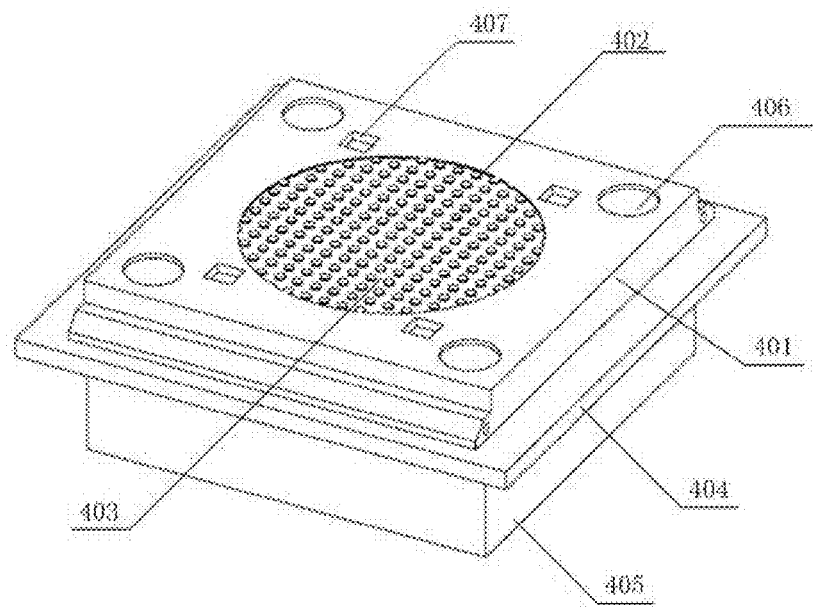
FIG. 4 is a diagram of six freedom degree magnetically levitated micro movement wafer stage.
Figure 5:
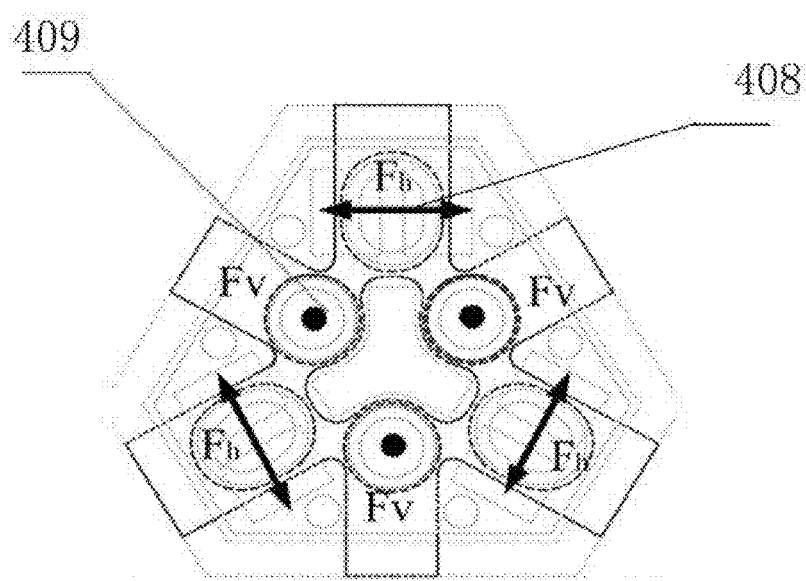
FIG. 5 is a structural diagram of the micro-movement planar motor and the gravity compensator.
Figure 6:
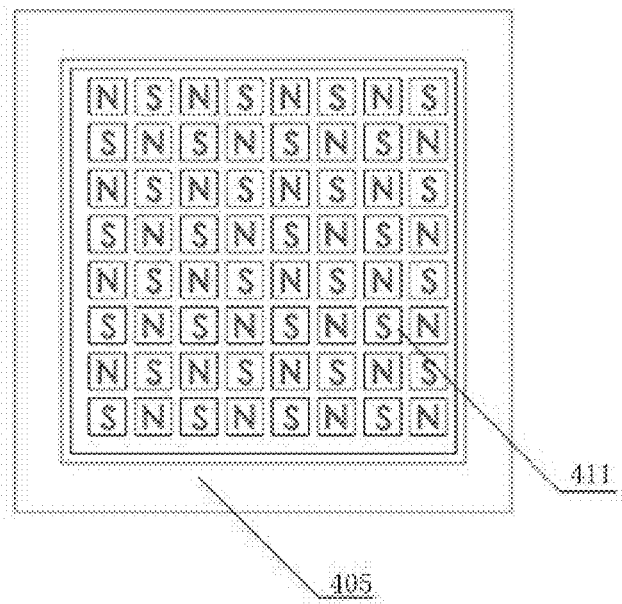
FIG. 6 is a schematic diagram of magnetic array arrangement of the mover of the macro-movement planar motor.
Figure 7:
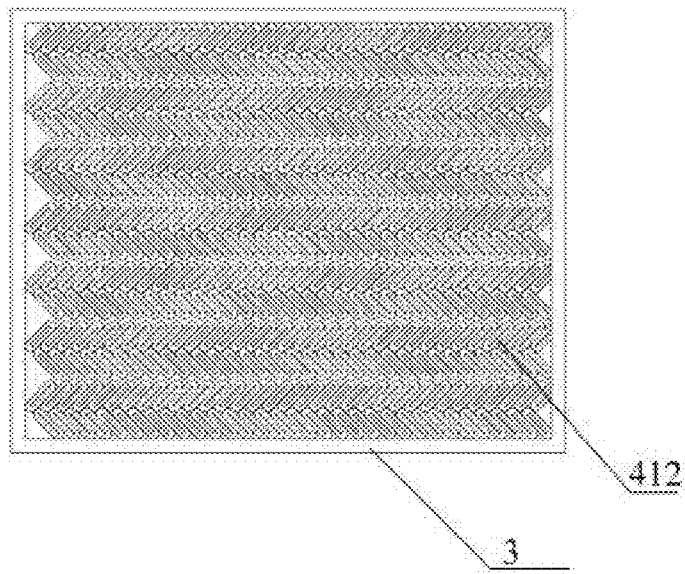
FIG. 7 is a schematic diagram of stator coil array arrangement of the macro-movement planar motor.

The part numbers in the above figures:
support frame 1;
balance mass block 2;
stator of macro movement planar motor 3;
first wafer stage 4a;
second wafer stage 4b;
first wireless energy transmitter apparatus 5a;
second wireless energy transmitter apparatus 5b;
laser interferometer 6;
airbearing 9;
metrology frame 10;
measurement position 11;
exposure position 12;
chuck 401;
sucker 402;
micro planar motor 403;
anti-collision frame 404;
mover of macro movement planar motor 405;
wireless energy receiver apparatus 406;
leveling focusing sensor 407;
mover of micro movement planar motor 408;
mover of gravity compensator 409;
magnetic steel array 411;
coil arrays 412.

DESCRIPTION OF THE PREFERRED EMBODIMENTS

Detailed implementations of the presented invention will be elaborated with reference to the appended drawings. The proposed method comprises: in an initial working state, providing a first wafer stage in a pre-alignment state in a measurement position, providing a second wafer stage in an exposure state in an exposure position; in a first step, completing a pre-alignment process of the first wafer stage in the measurement position, driving the first wafer stage by a moving magnet to a preset pre-transposition position A of the measurement position, the first wafer stage is then charged by wireless energy transmission and waits; Completing an exposure process of the second wafer stage in the exposure position, driving the second wafer stage by the moving magnet to a preset position C of the exposure position; In a second step, moving the first wafer stage and the second wafer stage counterclockwise along a vector circular arc path through a vector control of a planar motor, during the movement, maintaining the phases of the first and second wafer stages unchanged and measuring the movement positions of the first and the second wafer stages by laser interferometers; Completing the switching process of the first and the second wafer stages by moving the first wafer stage to the preset position C in the exposure position and moving the second wafer stage to a preset position D in the measurement position; Then a silicon wafer in the first wafer stage is lithographed and exposed in the exposure position and once the exposure is finished, the finished one is replaced by a new silicon wafer and the new silicon wafer is pre-aligned on the second wafer stage in the measurement position; In a third step, completing a pre-alignment process in the measurement position, driving the second wafer stage to the preset position A of the measurement position, then the second wafer stage is then charged by wireless energy transmission and waits; Completing an exposure process in the exposure position, driving the first wafer stage to the preset position C of the exposure position. In a fourth step, moving the second wafer stage and the first wafer stage clockwise along the circular arc path through another vector control of the planar motor. When the second wafer stage is moved to the preset position C in the exposure position and the first wafer stage is moved to the preset position D in the measurement position, the transposition process of wafer stages is completed, the silicon wafer in the second wafer stage is lithographed and exposed in the exposure position and the finished wafer is replaced by another new silicon wafer; The new silicon wafer is pre-aligned on the first wafer stage in the measurement position; At this time, the system returns to the initial working state, an operating cycle of transposition operation of the two wafer stages is completed, and the measurement, exposure, and transposition processes of the charge and communication of two wafer stages are all completed via wireless energy transmission.

The proposed apparatus is a vector arc revolve switching apparatus for a moving-magnet-steel magnetic-levitation double-workpiece-stage system based on wireless energy transmission; The apparatus comprises a support frame 1, a balance mass block 2, a first wafer stage 4a, a second wafer stage 4b. The balance mass block 2 is positioned above the support frame 1, a stator of macro movement planar motor 3 is mounted on an upper surface of the balance mass block 2; the first wafer stage 4a and the second wafer stage 4b are arranged above the stator of macro movement planar motor 3; the first wafer stage 4a and the second wafer stage 4b are operatable between a measurement position 11 and an exposure position 12, a metrology frame 10 is supported on the support frame 1 by airbearing 9 and six laser interferometers 6 are installed on the metrology frame, the first wireless energy transmitter apparatus 5a and the second wireless energy transmitter apparatus 5b are installed above the first wafer stage 4a and the second wafer stage 4b respectively; the first wafer stage 4a and the second wafer stage 4b are both six-DOF (degree of freedom) magnetic levitation micro movement stage, which is comprised of a chuck 401, a sucker 402, a micro movement planar motor 403, an anti-collision frame 404, a mover of the macro movement planar motor 405, wireless energy receivers apparatus 406 and a leveling focusing sensor 407; the micro movement planar motor 403 is comprised of a mover of micro movement planar motor 408 and a mover of gravity compensator 409; the sucker 402 is mounted on the chuck 401, and four corners of the chuck 401 are provided with four wireless energy receiver apparatus 406 and four leveling focusing sensors 407; the chuck 401 is fixed to the micro movement planar motor 403, and the anti-collision frame 404 is mounted around the micro movement planar motor 403; the mover of macro movement planar motor 405 is arranged below the anti-collision frame 404; the mover of macro movement planar motor 405 is formed by staggered arrangement of magnetic steel arrays 411 and the stator of macro movement planar motor 3 is arranged in herringbone arrangement of the coil arrays 412.

The workflow of the presented invention is as follows: After the pre-alignment is completed in the measurement position 11, the first wafer stage 4a is driven by moving magnet to the transposition position A and waits the exposure of the second wafer stage 4b in the exposure position 12. After the exposure is completed in the exposure position, the second wafer stage 4b is driven by moving magnet to the table transposition position B, the first wafer stage 4a and the second wafer stage 4b are moved counterclockwise along the circular arc path by the planar motor vector control to complete the stage transposition operation. After the stage transposition completed, the first wafer stage 4a is moved to the exposure position 12 to be exposed, and the second wafer stage 4b is moved to the measurement position 11 to change and pre-align the silicon wafer. After the wafer pre-alignment completed, the second wafer stage 4b is moved to the stage transposition position A' in the measurement position, and waiting the first wafer stage 4a is moved to the stage transposition position B' after the completion of the exposure. Then, the second wafer stage 4b and the first wafer stage 4a are moved clockwise along the arc path by the planar motor vector control to complete the second stage transposition process. After the stage transposition completed, the first wafer stage 4a moves toward the measurement position 11 and the second wafer stage 4b moves toward the exposure position 12, thus an integrated working cycle is completed.

What is claimed is:

1. An apparatus comprising:
a support frame,
a balance mass block,
a first wafer stage,
a second wafer stage;
wherein the balance mass block is positioned above the support frame, and a stator of a planar motor is mounted on an upper surface of the balance mass block;
wherein the first wafer stage and the second wafer stage are arranged above the stator;
wherein the first wafer stage and the second wafer stage are configured to move between a measurement position and an exposure position on the stator;
wherein a metrology frame is supported on the support frame by an air bearing;
wherein six laser interferometers are installed on the metrology frame;
wherein a first wireless energy transmitter and a second wireless energy transmitter are installed above the first wafer stage and the second wafer stage respectively;
wherein the first wafer stage and the second wafer stage are both six-DOF (degrees of freedom) magnetic levitation stages, and each comprise a chuck, a suction cup, a micro movement planar motor, an anti-collision frame, a mover of the planar motor, wireless energy receivers and leveling focusing sensors;
wherein the micro movement planar motor comprises a planar mover and a gravity compensation mover;
wherein the suction cup is mounted on the chuck, and corners of the chuck are provided with the wireless energy receivers and leveling focusing sensors;
wherein the chuck is fixed to the planar motor, and the anti-collision frame is mounted around the planar motor;
wherein the mover of the planar motor is arranged below the anti-collision frame;
wherein the mover of the planar motor comprises magnetic steel arrays with a staggered arrangement and the stator comprises coil arrays with a herringbone arrangement.

* * * * *